(12) United States Patent
Sakamoto

(10) Patent No.: US 10,944,481 B2
(45) Date of Patent: Mar. 9, 2021

(54) COHERENT SAMPLING

(71) Applicant: NATIONAL INSTITUTE OF INFORMATION AND COMMUNICATIONS TECHNOLOGY, Koganei (JP)

(72) Inventor: Takahide Sakamoto, Koganei (JP)

(73) Assignee: National Institute of Information and Communications Technology, Tokyo (JP)

( * ) Notice: Subject to any disclaimer, the term of this patent is extended or adjusted under 35 U.S.C. 154(b) by 200 days.

(21) Appl. No.: 16/305,057

(22) PCT Filed: May 12, 2017

(86) PCT No.: PCT/JP2017/018006
§ 371 (c)(1),
(2) Date: Nov. 28, 2018

(87) PCT Pub. No.: WO2017/208780
PCT Pub. Date: Dec. 7, 2017

(65) Prior Publication Data
US 2020/0322060 A1 Oct. 8, 2020

(30) Foreign Application Priority Data

May 31, 2016 (JP) .............................. JP2016-109633

(51) Int. Cl.
*H04B 10/61* (2013.01)
*G01M 11/02* (2006.01)
(Continued)

(52) U.S. Cl.
CPC ............. *H04B 10/61* (2013.01); *G01M 11/02* (2013.01); *G01R 13/0272* (2013.01);
(Continued)

(58) Field of Classification Search
CPC ..... H04B 10/079; H04B 10/61; G01M 11/02; G01R 13/0272
See application file for complete search history.

(56) References Cited

U.S. PATENT DOCUMENTS

| | | | |
|---|---|---|---|
| 2004/0114939 A1* | 6/2004 | Taylor | H04B 10/64 398/152 |
| 2012/0134667 A1* | 5/2012 | Westlund | H04B 10/64 398/25 |

(Continued)

FOREIGN PATENT DOCUMENTS

| | | |
|---|---|---|
| JP | WO2002/082038 A1 | 10/2002 |
| JP | 2004-28652 A | 1/2004 |

(Continued)

OTHER PUBLICATIONS

International Search Report of International Patent Application No. PCT/JP2017/018006 completed Jul. 21, 2017 and dated Aug. 1, 2017 (3 pages).

(Continued)

*Primary Examiner* — Dzung D Tran
(74) *Attorney, Agent, or Firm* — Pyprus Pte Ltd

(57) ABSTRACT

To realize sampling (signal measurement) and analysis of a signal to be measured easily at low cost by capturing optical phase fluctuation even when low-speed sampling is carried out. This sampling method includes: a step for acquiring main sampling points at a repetition period equal to or less than a half of the band frequency of a signal to be measured; a step for acquiring sub-sampling points by executing sampling separately from that executed for the main sampling points; a step for acquiring an amplitude difference, a phase difference, and a frequency difference between the signal to be measured at each of the sub-sampling points and a reference signal; a step for acquiring a time difference, an amplitude difference ($\Delta A$), a phase difference ($\Delta \varphi$), and a (Continued)

frequency difference ($\Delta f$) between each of the main sampling points and each of the sub-sampling points; and a step for acquiring the amplitude fluctuation, the phase fluctuation, and the frequency fluctuation of the signal to be measured by using the time difference ($\Delta t$), the amplitude difference ($\Delta A$), the phase difference ($\Delta \varphi$), and the frequency difference ($\Delta f$) between each of the main sampling points and each of the sub-sampling points.

6 Claims, 8 Drawing Sheets

(51) Int. Cl.
　　　*G01R 13/02*　　　(2006.01)
　　　*G01R 13/34*　　　(2006.01)
　　　*H04B 10/079*　　(2013.01)
　　　*H04L 27/26*　　　(2006.01)
(52) U.S. Cl.
　　　CPC ........... *G01R 13/34* (2013.01); *H04B 10/079* (2013.01); *H04L 27/2613* (2013.01)

(56) References Cited

U.S. PATENT DOCUMENTS

| 2014/0212132 | A1* | 7/2014 | Saito | H04L 25/03 |
| | | | | 398/25 |
| 2016/0124086 | A1* | 5/2016 | Jansen | G01S 13/931 |
| | | | | 342/93 |

FOREIGN PATENT DOCUMENTS

| JP | 2007-24657 A | 2/2007 |
| JP | 2011199645 A | 10/2011 |
| JP | 2011199657 A | 10/2011 |

OTHER PUBLICATIONS

Written Opinion of International Patent Application No. PCT/JP2017/018006 completed Jul. 21, 2017 and dated Aug. 1, 2017 (4 pages).
Denis Derickson, "Fiber Optic Test and Measurement", Oct. 18, 1998.
H. Takara, "100 Gbit/s optical waveform measurement with 0.6 ps resolution optical sampling using subpicosecond supercontinuum pulses", Jul. 7, 1994.

* cited by examiner

COHERENT SAMPLING

TECHNICAL FIELD

The present invention relates to a method for sampling a signal, and to a system for sampling.

BACKGROUND ART

Signal multiplexing is advancing rapidly. For example, 10 to 100 optical signal channels are currently being multiplexed in the time domain, and the optical transmission speed is approaching 100 gigabits/second to several terabits/second. More complicated optical multiplexing methods are also attracting attention. Examples of such optical multiplexing methods are coherent optical transmission methods such as optical phase shift keying (optical PSK) and optical quadrature amplitude modulation (optical QAM) and so on, and optical orthogonal frequency division multiplexing (optical OFDM) and optical code division multiplexing (optical OCDM). In order to measure optical signals of this type, coherent optical measuring instruments based upon real time (full rate) sampling oscilloscopes are employed. These are devices that perform high speed sampling of an optical signal to be measured at a frequency at least as high as the symbol rate on the time axis, and that evaluate the signal to be measured on the basis of the sampling points.

In particular, when performing sampling of a coherent optical signal, optical phase synchronization with the carrier signal of the signal to be measured is required, and this signal processing step is performed by digital signal processing. In this case, the frequency (i.e. the rate) of acquisition of sampling points is high, so that signal processing in real time is difficult. Due to this, the signal processing circuitry is provided in parallel. Moreover, since the data acquired at the sampling points is processed after having been temporarily stored in a large-scale memory, accordingly the actual processing is performed off-line. Therefore, in prior art devices, it has been necessary to provide a high speed sampling system or an analog/digital converter whose symbol rate is at least that of the signal to be measured.

Since the phase information is lost when performing low speed sampling of a coherent signal, accordingly it becomes impossible to measure and evaluate phase fluctuations. For example, if optical fiber communication is assumed, as one example, phase variation of a laser signal that is used as an optical carrier or local light is a major cause of optical phase fluctuations. Furthermore, the optical phase also fluctuates due to wavelength dispersion and due to non-linear effects in the optical fiber. And these fluctuations occur at extremely high speed, which causes waveform distortion of the symbols. As described above, if low speed sampling is performed, it becomes impossible to capture the optical phase fluctuations described above.

On the other hand, a sampling oscilloscope can be used for measuring a non-coherent optical signal. In this method, by low speed sampling, the time waveform of the optical signal is decimated and its time waveform is acquired and is evaluated. Since this method performs time waveform measurement by eye pattern measurement or by a fixed pattern, accordingly it is employed as a standard measurement method for high speed optical signals. However since, in this method, the measured signal light is limited to being intensity-modulated light, accordingly it is not possible to measure its optical phase, although changes of its intensity can be measured.

A demodulator is described in Japanese Patent 5,598,958. This demodulator samples an ultra high speed multilevel optical signal and down-converts it to low speed, and is able to demodulate the complex information with a low speed complex demodulation circuit, by electrically demodulating the complex signal on the basis of this low speed sampling and performing phase synchronization operation by feeding back emitted local light on the basis of this complex signal that has been demodulated, thus causing the ultra high speed multilevel signal and the phase synchronized signal to interfere with one another.

An optical sampling and demodulating method of the optical MSK modulation/arbitrary shift amount CPFSK type is described in Japanese Patent 5,522,572. In this technique, balanced demodulation is performed for each of the I component and the Q component of an continuous phase frequency modulated (CPFSK) optical signal, and it is possible to demodulate the CPFSK signal by inferring the phase of the carrier wave using a sampled signal, and by performing phase synchronized demodulation.

CITATION LIST

Patent Literature

Patent Document #1: Japanese Patent 5,598,958.
Patent Document #2: Japanese Patent 5,522,572.

Non-Patent Literature

Non-Patent Document #1: D. Derickson, Preventive Hall PTR, 1998.
Non-Patent Document #2: H. Takara et al., Electron lett., 1152-1153 (1994).

SUMMARY OF INVENTION

Technical Problem

The object of the present invention is to implement capture of optical phase fluctuations of a high frequency signal to be measured, and to implement sampling (i.e. signal measurement) and analysis of the signal simply and at low cost, even when the sampling is performed at low speed.

Solution to Technical Problem

Fundamentally, the present invention is based upon the finding that it is possible to obtain the amplitude fluctuations, the phase fluctuations, and the frequency fluctuations of a signal to be measured in a statistically accurate manner by combining performing sampling at an extremely low cycle of a repetition period of half or less the frequency band of the signal to be measured which is the subject for measurement, with predetermined sub-sampling.

An invention of this application related to a sampling method will now be explained. This sampling method is a method for obtaining the amplitude fluctuations, the phase fluctuations, and the frequency fluctuations of the signal to be measured, and includes the following processes:

a process (S110) of obtaining main sampling points at a repetition period that is half or less of the frequency band of the signal to be measured, which is the subject for measurement;

a process (S120) of obtaining sub-sampling points by performing sampling that is different from the main sampling points;

a process (S130) of, at each sampling point, obtaining the amplitude difference or ratio, the phase difference or ratio, and the frequency difference or ratio of the signal to be measured and a reference signal;

a process (S140) of obtaining the time differences ($\Delta t$) between the main sampling points and the sub-sampling points;

a process (S150) of obtaining the amplitude differences ($\Delta A$), the phase differences ($\Delta \varphi$), and the frequency differences ($\Delta f$) between the main sampling points and the sub-sampling points; and a process (S160) of obtaining the amplitude fluctuations, the phase fluctuations, and the frequency fluctuations of the signal to be measured by employing the time differences ($\Delta t$), the amplitude differences ($\Delta A$), the phase differences ($\Delta \varphi$), and the frequency differences ($\Delta f$) between the main sampling points and the sub-sampling points.

The number of sub-sampling points for each of the main sampling points may be one, or two or more; and while, in a preferred variant of the sampling method of the present invention, a single sub-sampling point is present for each of the main sampling points, it would also be acceptable for two or more to be present.

A preferred specialization of the sampling method of the present invention further includes the following processes:

A process (S131) of obtaining the amplitude fluctuations, the phase fluctuations, and the frequency fluctuations of the reference signal between the main sampling points and the sub-sampling points;

A process (S133) of obtaining sampling correction values at the main sampling points and the sub-sampling points by employing the amplitude fluctuations, the phase fluctuations, and the frequency fluctuations of the reference signal that have been obtained;

And a process (S140) of obtaining the amplitude differences ($\Delta A$), the phase differences ($\Delta \varphi$), and the frequency differences ($\Delta f$) between the main sampling points and the sub-sampling points, being a process of obtaining the amplitude differences ($\Delta A$), the phase differences ($\Delta \varphi$), and the frequency differences ($\Delta f$) between the main sampling points and the sub-sampling points by employing the sampling correction values and the amplitude differences (or the amplitude ratios), the phase differences (or the phase ratios), and the frequency differences (or the frequency ratios) between the signal to be measured and the reference signal at each of the sampling points.

Next, an invention of this application relating to a sampling system will be explained. This sampling system comprises a mixing section 17, a time delay control section 19, a sampling section 21, and a signal processing section 23.

The mixing section 17 is an element that is connected in a propagation path 13 along which a signal to be measured 11 is propagated, and that mixes the signal to be measured 11 propagated along the propagation path 13 and a reference signal 15.

The time delay control section 19 is an element for, from the signal to be measured and the reference signal that have been mixed by the mixing section, obtaining main sampling points at a repetition period that is half or less of the frequency band of the signal to be measured, and obtaining sub-sampling points at which sampling that is different from the main sampling points is performed.

The sampling section 21 is an element that, at each sampling point (i.e. at each main sampling point and at each sub-sampling point), obtains the amplitude difference or ratio, the phase difference or ratio, and the frequency difference or ratio of the signal to be measured and the reference signal.

And the signal processing section 23:

obtains the time differences ($\Delta t$) between the main sampling points and the sub-sampling points; obtains amplitude differences ($\Delta A$) which are the amplitude differences or ratio differences of the signal to be measured and the reference signal at the main sampling points and the sub-sampling points, phase differences ($\Delta \varphi$) which are the phase differences or ratio differences of the signal to be measured and the reference signal at the main sampling points and the sub-sampling points, and frequency differences ($\Delta f$) which are the frequency differences or ratio differences of the signal to be measured and the reference signal at the main sampling points and the sub-sampling points; and obtains the amplitude fluctuations, the phase fluctuations, and the frequency fluctuations of the signal to be measured by employing the time differences ($\Delta t$), the amplitude differences ($\Delta A$), the phase differences ($\Delta \varphi$), and the frequency differences ($\Delta f$) between the main sampling points and the sub-sampling points.

It is desirable for this sampling system 25 further to comprise:

a reference signal fluctuation acquisition section 27 that obtains the amplitude fluctuations, the phase fluctuations, and the frequency fluctuations of the reference signal between the main sampling points and the sub-sampling points; and a compensation section 29 that compensates the sampling signals that have been sampled by the sampling section 21 or the signal processing section 23 by employing the amplitude fluctuations, the phase fluctuations, and the frequency fluctuations of the reference signal.

A different structure for the sampling system 25 other than that described above is one as described below.

That is, this sampling system 25 comprises a time delay control section 35, a mixing section 39, a sampling section 41, and a signal processing section 43.

The time delay control section 35 is an element that is connected in a propagation path 33 along which a signal to be measured 31 is propagated, for obtaining main sampling points at a repetition period that is half or less of the frequency band of the signal to be measured, and also for obtaining sub-sampling points by performing sampling at a predetermined time difference from the main sampling points.

The mixing section 39 is an element that mixes the signal to be measured outputted from the time delay control section 35 and a reference signal 37.

The sampling section 41 is an element that, at each sampling point, obtains the amplitude difference or ratio, the phase difference or ratio, and the frequency difference or ratio of the signal to be measured and the reference signal.

And the signal processing section 43 is an element for:

obtaining the time differences ($\Delta t$) between the main sampling points and the sub-sampling points; obtaining amplitude differences ($\Delta A$) which are the amplitude differences or ratio differences of the signal to be measured and the reference signal at the main sampling points and the sub-sampling points, phase differences ($\Delta \varphi$) which are the phase differences or ratio differences of the signal to be measured and the reference signal at the main sampling points and the sub-sampling points, and frequency differences ($\Delta f$) which are the frequency differences or ratio differences of the signal to be measured and the reference signal at the main sampling points and the sub-sampling points; and obtaining the amplitude fluctuations, the phase fluctuations, and the frequency fluctuations of the signal to be measured by employing the time differences ($\Delta t$), the amplitude differences ($\Delta A$), the phase differences ($\Delta \varphi$), and the frequency differences ($\Delta f$) between the main sampling points and the sub-sampling points.

Advantageous Effects of Invention

Even when the sampling is performed at low speed, it is possible to implement capture of the optical phase fluctuations of the signal to be measured, and to implement sampling (i.e. signal measurement) and analysis of the signal simply and at low cost.

DESCRIPTION OF EMBODIMENTS

Embodiments of the invention will now be explained with reference to the drawings. However, the present invention is not limited to the embodiments explained below; appropriate variations of the following embodiments that are self-evident to a person skilled in the relevant art are also to be considered as coming within its range.

Figure 1:
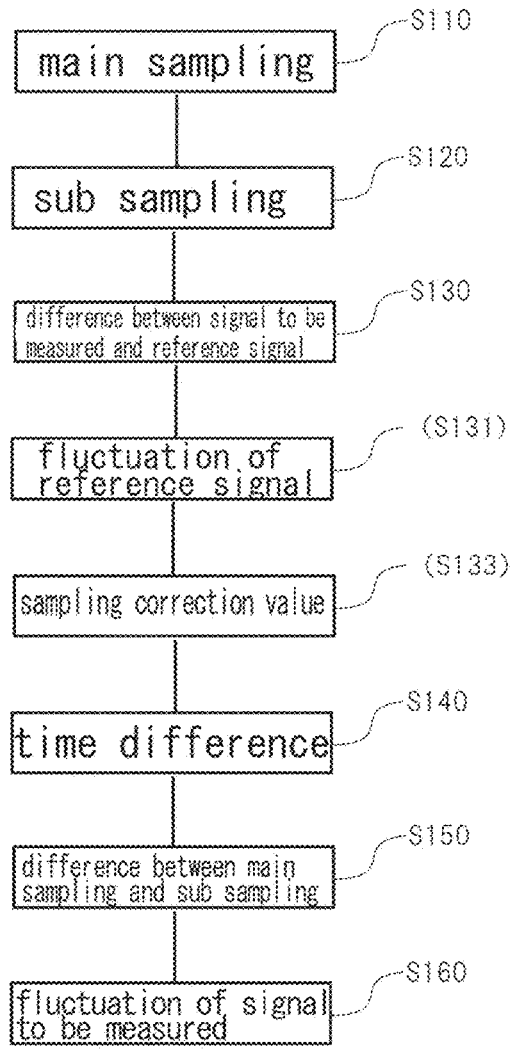
FIG. 1 is a flow diagram for explanation of a sampling method according to the present invention.

FIG. 1 is a flow diagram for explanation of the sampling method of the present invention. "S" in the figure denotes a step (i.e. a process); these processes are conceptual constructs for explanation of the sampling method of the present invention, and are not intended necessarily to be performed in the shown order. This sampling method obtains the amplitude fluctuations, the phase fluctuations, and the frequency fluctuations of a signal to be measured, and includes the various processes described in FIG. 1.

The Main Sampling Process (S110)

The main sampling process is a process of obtaining sampling points at a repetition period of half or less of the frequency band of the signal to be measured, which is the subject of measurement. "Obtaining sampling points" means performing measurement (i.e. sampling), and obtaining data of various types at those time points. The signal to be measured and a reference signal may be optical signals, wireless signals, or may be electrical signals. A preferred example of the signal to be measured is a coherent signal, and in particular is preferably a coherent optical signal or a high speed coherent signal. A concrete example of a coherent signal is a coherent signal of 100 gigabit/second; and a coherent signal of 1000 gigabit/second or more would also be acceptable. Examples of signals are an optical PSK signal, an optical QAM signal, an optical ASK signal, an optical FSK signal, an optical CPFSK signal, an optical APSK signal, and an optical MSK signal (refer to Japanese Patent 5099506). And examples of reference light are continuous (CW) light, pulse light, and optical comb signals (refer to Japanese Patents 5665038 and 5299859).

In the main sampling process, for example, for a signal in which the signal to be measured and the reference signal are mixed together, the amplitude, the phase, and the frequency of the signal to be measured and the reference signal are measured. At this time, the times at which the main sampling is performed could also be stored. It should be understood that it would be possible for all of the amplitude, the phase, and the frequency to be measured, or for any one or more of these to be measured, or for one or more other factors also to be measured.

The "frequency band" of the signal to be measured means the frequency range between the lowest frequency and the highest frequency of the signal that is employed for propagation. The frequency band could also be a value determined according to the type of the signal to be measured.

Examples of the frequency band of the signal to be measured are 106 MHz and 48 MHz. The frequency band of the signal to be measured may be between 1 Hz and 10 THz inclusive, or may be between 1 MHz and 1 THz inclusive, or may be between 1 MHz and 1 GHz inclusive, or may be between 1 MHz and 100 MHz. It would also be acceptable for the frequency band of the signal to be measured to be greater than or equal to the DC frequency (0 Hz).

The main sampling process is performed at a repetition period of half or less of the frequency band of the signal to be measured, i.e. of the signal that is the subject for measurement. This period could also be ⅓ or less, or 1/10 or less, or 1/20 or less, of the frequency band of the signal to be measured. If sampling is performed at low frequency, then it is possible to reduce heat production from the circuitry, since the number of times that processing is performed is reduced, and as a result it is possible to alleviate fluctuations or distortions due to heating.

The sampling may be performed by employing a sampling device of a per se known type.

The Sub-Sampling Process (S120)

The sub-sampling process (S120) is a process of performing sampling at points that are separate from the main sampling points, and of obtaining these sub-sampling points.

Sub-sampling may be performed on the same cycle as the main sampling, or may not be performed on the same cycle. Moreover, the sub-sampling points may be either before the main sampling points in time, or after them. While the figure schematically shows that the sub-sampling process (S120) is performed after the main sampling process (S110), normally these processes are performed in parallel (i.e. simultaneously).

In the sub-sampling process, for example, for a signal in which the signal to be measured and the reference signal are mixed together, the amplitude, the phase, and the frequency of the signal to be measured and the reference signal are measured. At this time, the times at which the sub-sampling was performed may also be stored. It should be understood that it would be possible for all of the amplitude, the phase, and the frequency to be measured, or for any one or more of these to be measured, or for one or more other factors also to be measured.

It is desirable for the time difference ($\Delta t$) of each sub-sampling point relative to some main sampling point to be short. In concrete terms, it is desirable for the phase fluctuation between the reference signal at the main sampling point and at the sub-sampling point to be in the range of $1/10$ or less. This fact that the phase fluctuation of the reference signal at the main sampling point and at the sub-sampling point is in the range of $1/10$ or less means that the value obtained by subtracting the smaller, among the phases of the reference signal at the main sampling point and at the sub-sampling point, from the larger thereof, and then dividing by the larger thereof, is $1/10$ or less. This phase variation may be adjusted to be $1/15$ or less, $1/20$ or less, $1/50$ or less, or $1/100$ or less.

The above description is an example of adjusting the time difference ($\Delta t$) according to, for example, the phase fluctuation, and it would also be acceptable to adjust the time difference by employing the amplitude fluctuation or the frequency fluctuation, instead of employing the phase fluctuation. Since the magnitude of the phase fluctuation is large as compared to the amplitude fluctuation or the frequency fluctuation, accordingly, provided that the phase fluctuation is a predetermined value or less, then it may be statistically inferred that the amplitude fluctuation and the frequency fluctuation are no more than that value. Due to this, if the time difference ($\Delta t$) is controlled by employing any one of the above fluctuation values, it is desirable to control the time difference ($\Delta t$) by employing the value of the phase fluctuation. However, it would naturally also be acceptable to adjust the time difference ($\Delta t$) so that two or more of the phase fluctuation, the amplitude fluctuation, and the frequency fluctuation of the reference signal are $1/10$ or less, ($1/15$ or less, $1/20$ or less, $1/50$ or less, or $1/100$ or less).

When a hypothesis based upon the measured amount of fluctuation of the time difference ($\Delta t$) has been formulated, it is also possible to set amounts in statistical tests of various types (for example, a t-test) for entering into a rejection region and becoming an amount at which the hypothesis is rejected.

When the time difference described above is expressed qualitatively, the time difference between the main sampling points and the sub-sampling points is to be shorter than the coherence time of the signal to be measured (i.e. the coherence time of the beat component between the signal to be measured and the reference signal). If the signal to be measured and the reference signal are taken as being continuous light, then the optical phase difference measured at the main sampling point and the sub-sampling point when the phase fluctuation amount is less than or equal to plus or minus $\pi$ can be regarded as being the amount of variation (i.e. the fluctuation amount) of the optical phase.

The number of sub-sampling points for each single main sampling point may be one, or may be two or more. If the number of sub-sampling points for each single main sampling point is two, there is the technical merit that it is possible to perform measurement of a signal that is asymmetric with respect to the time axis. Moreover, in this case, if three-point measurement is performed in which it is possible to assign weightings due to measurement at three points, then the fact that it is possible to treat anomalous values as points not to be used means that it is possible to enhance the accuracy of measurement.

Whether the time difference ($\Delta t$) of the sub-sampling points relative to their main sampling points is short or not, it is possible to perform sampling in an appropriate manner by employing the processing described below.

The sub-sampling may be performed by employing a per se known sampling device. The sub-sampling could be performed by employing the same sampling device as that used for the main sampling, or by employing a different sampling device as the sub-sampling device. In either case, it is desirable for all the results of sampling to be sent to a single signal processing device (for example, a computer).

The Process of Obtaining the Differences, or the Ratios, Between the Signal to be Measured and the Reference Signal (S130)

The process (S130) of obtaining the differences, or the ratios, between the signal to be measured and the reference signal is a process of obtaining the amplitude difference or the amplitude ratio between the signal to be measured and the reference signal at each sampling point (i.e. at each main sampling point and each sub-sampling point), or their phase difference or their phase ratio, and their frequency difference or their frequency ratio.

In more concrete terms, since one or a plurality of sub-sampling points are present corresponding to each of the main sampling points, this is a process of obtaining the amplitude difference, the phase difference, and the frequency difference, or alternatively the amplitude ratio, the phase ratio, and the frequency ratio, between the signal to be measured and the reference signal by employing the sampling data (the amplitudes, phases, and frequency values of the signal to be measured and the reference signal) for the main sampling points and the sub-sampling points. The amplitude differences, the phase differences, and the frequency differences are the differences between the amplitudes, the phases, and the frequencies of the signal to be measured and the reference signal. And the amplitude ratios, the phase ratios, and the frequency ratios are the ratios between the amplitudes, the phases, and the frequencies of the signal to be measured and the reference signal. For example, the amplitude differences between the signal to be measured and the reference signal can be obtained by obtaining the differences between the amplitudes of the signal to be measured and the amplitudes of the reference signal at main sampling points or at sub-sampling points. And the amplitude ratios between the signal to be measured and the reference signal can be obtained by dividing the amplitudes of the signal to be measured by the amplitudes of the reference signal at main sampling points or at sub-sampling points.

A preferred version of the sampling method of the present invention further includes the following processes:

The Process of Obtaining the Amplitude Fluctuation, the Phase Fluctuation, and the Frequency Fluctuation of the Reference Signal Between the Main Sampling Points and the Sub-Sampling Points (S131) and The Process of Obtaining Sampling Correction Values for the Main Sampling Points and the Sub-Sampling Points by Employing the Amplitude Fluctuations, the Phase Fluctuations, and the Frequency Fluctuations of the Reference Signal that have been Obtained (S133)

The Process of Obtaining the Fluctuation of the Reference Signal (S131)

The process of obtaining the fluctuation of the reference signal is a process of obtaining the amplitude fluctuations, the phase fluctuations, and the frequency fluctuations of the reference signal between the main sampling points and the sub-sampling points. In this process, for example, the phase fluctuations of the reference signal between the main sampling points and the sub-sampling points are actually measured; and it would also be possible to obtain the amplitude fluctuations and the phase fluctuations from the values that are actually measured. It would also be acceptable to arrange to estimate the other fluctuations statistically from the actually measured values, or to store the amplitude fluctuations and/or the frequency fluctuations corresponding to phase fluctuations in advance, and to obtain the amplitude fluctuations and/or the frequency fluctuations by employing the actually measured phase fluctuations. In a similar manner, it would also be acceptable actually to measure the amplitude fluctuations or the frequency fluctuations, and to obtain the other fluctuations therefrom.

The Process of Obtaining the Sampling Correction Values (S133)

The process of obtaining the sampling correction values (S133) is a process of obtaining sampling correction values at the main sampling points and at the sub-sampling points by employing the amplitude fluctuations, the phase fluctuations, and the frequency fluctuations of the reference signal that were obtained in the process (S131) described above of obtaining the fluctuations of the reference signal.

The Process of Obtaining the Time Differences ($\Delta t$) (S140)

The process of obtaining the time differences ($\Delta t$) (S140) is a process of obtaining the time differences ($\Delta t$) between the main sampling points and the sub-sampling points.

In this process, if the main sampling points and the sub-sampling points are sampled at a time difference that is set in advance, then it would be acceptable to derive these time differences ($\Delta t$) between the main sampling points and the sub-sampling points by employing this time difference that has been set. Moreover, it would also be acceptable to arranged to measure the sampling times of the main sampling points and the sub-sampling points, and to derive their time differences ($\Delta t$) by employing the differences between them.

The Process of Obtaining the Differences Between the Main Sampling Points and the Sub-Sampling Points (S150)

The process of obtaining the differences between the main sampling points and the sub-sampling points (S150) is a process of obtaining the amplitude differences ($\Delta A$), the phase differences ($\Delta \varphi$), and the frequency differences ($\Delta f$) between the main sampling points and the sub-sampling points. To put it in another manner, this process is a process of obtaining, for the main sampling points and for the sub-sampling points, the amplitude differences or ratios of the signal to be measured and the reference signal ($\Delta A$), their phase differences or ratios ($\Delta \varphi$), and their frequency differences or ratios ($\Delta f$).

In other words, in the process (S130) of obtaining the differences between the signal to be measured and the reference signal, since the amplitude differences or ratios between the signal to be measured and the reference signal at the main sampling points, their phase differences or ratios, and their frequency differences or ratios, and/or the amplitude differences or ratios between the signal to be measured and the reference signal at the sub-sampling points, their phase differences or ratios, and their frequency differences or ratios are obtained, accordingly the amplitude differences or ratios of the sub-sampling points corresponding to the main sampling points, their phase differences or ratios, and their frequency differences or ratios are compared together, and their amplitude differences ($\Delta A$), their phase differences ($\Delta \varphi$), and their frequency differences ($\Delta f$), which are the differences between them, are thereby obtained.

It would also be acceptable to obtain the amplitude differences ($\Delta A$), the phase differences ($\Delta \varphi$), and the frequency differences ($\Delta f$) of the main sampling points and the sub-sampling points by employing the sampling correction values and the amplitude differences or ratios, the phase differences or ratios, and the frequency differences or ratios of the signal to be measured and the reference signal at each of the sampling points.

The Process of Obtaining the Amplitude Fluctuations, the Phase Fluctuations, and the Frequency Fluctuations of the Signal to be Measured (S160)

The process of obtaining the amplitude fluctuations, the phase fluctuations, and the frequency fluctuations of the signal to be measured (S160) is a process of obtaining the amplitude fluctuations, the phase fluctuations, and the frequency fluctuations of the signal to be measured by employing the time differences ($\Delta t$), the amplitude differences ($\Delta A$), the phase differences ($\Delta \varphi$), and the frequency differences ($\Delta f$) of the main sampling points and the sub-sampling points.

In a preferred variation of the sampling method of the present invention, two sub-sampling points are present for each one of the main sampling points. When two sub-sampling points are present, then it is possible to exclude sub-sampling points, whose values are anomalous as compared to the values at the main sampling points, from the measurement process. Moreover, when two sub-sampling points are present, then it is possible to obtain more accurate fluctuation values, since measured values are obtained at three points, including each of the main sampling points.

Next, the amounts of distortion (i.e. compensation values) of the signal to be measured that has been received are obtained by employing any one, or two or more, of these fluctuation amounts of the signal to be measured that have thus been obtained, i.e. the amplitude fluctuations, the phase fluctuations, and the frequency fluctuations. This process of obtaining the amounts of distortion (i.e. compensation values) of the signal to be measured on the basis of its amplitude fluctuations, its phase fluctuations, and its frequency fluctuations is per se known. In other words, since the fluctuation values constitute distortions of the signal, accordingly, if just these amounts of distortion are compensated, then it becomes possible to reconstruct (i.e. to demodulate) the original signal with the distortion components removed.

In other words, the present invention is used for obtaining the amounts of distortion of the signal to be measured (i.e. the compensation values) by employing the amplitude fluctuations, the phase fluctuations, and the frequency fluctuations of the signal to be measured that have been obtained as described above. And it would also be acceptable to compensate the distortion of the signal to be measured by employing the amounts of distortion (i.e. the compensation values) of the signal to be measured that have been thus obtained, or, when measuring the signal to be measured, to correct for the distortion, thus obtaining the signal to be measured.

Furthermore, the present invention can also include a process of obtaining a transfer function for the transmission medium by employing the amounts of distortion (i.e. the compensation values) that have been obtained as described above. If a transfer function for the transmission medium is obtained, then it becomes possible to forecast the amounts of distortion (i.e. the compensation values) when, in the future, demodulating a different signal to be measured, provided that the same transmission medium is employed.

Figure 2:
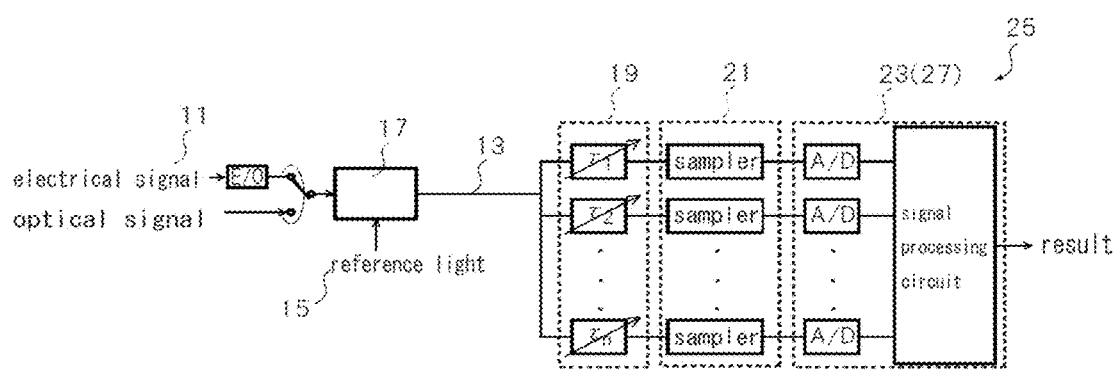
FIG. 2 is a block diagram for explanation of a sampling system according to the present invention.

Next, the invention of this application relating to a sampling system will be explained. FIG. 2 is a block diagram for explanation of the sampling system of the present invention. As shown in FIG. 2, this sampling system comprises a mixing section 17, a time delay control section 19, a sampling section 21, and a signal processing section 23. In FIG. 2, optical signals are mixed by the mixing section. However, it would also be acceptable to arrange to perform photoelectric conversion upon the optical signals, and to process them as electrical signals. The mixing section 17 is a section that is connected in the propagation path 13 along which the signal to be measured 11 is propagated, and that mixes the signal to be measured 11 that is being propagated along the propagation path 13 with a reference signal 15. If an optical signal is being handled, then the mixing section may be a coupler or a complex optical mixer. Moreover, other than a homodyne mixer, a heterodyne mixer or an all-optical mixer may be used for the mixing section 17. The time delay control section 19 is an element for obtaining, from the signal to be measured and the reference signal that have been mixed together by the mixing section, main sampling points at a repetition period of half or less of the frequency band of the signal to be measured, and for performing sampling for obtaining sub-sampling points that are separate from those main sampling points. In the example shown in FIG. 2, the optical signals are branched, and each of the branched signals is subjected to a time delay. The time delay may be changed by adjusting the optical path length, or, alternatively, a predetermined time delay may be imposed upon the signal by employing a per se known method, such as an electrical method of applying a voltage to the waveguide, or changing the temperature of the waveguide or the like.

The sampling section 21 is a section for obtaining, for each sampling point (i.e. for each main sampling point and each sub-sampling point) the difference or the ratio of the amplitudes of the signal to be measured and the reference signal, and the difference or the ratio of their phases, and the difference or the ratio of their frequencies. The sampling section 21 includes a detection system such as a sampler or the like, so that it is capable of measuring the desired information. A per se known type of sampler is one example of such a sampling section 21. It is desirable for such a sampler to have a band at least as wide as the frequency band of the signal to be measured (i.e. a band that covers the frequency band of the signal to be measured). If the band of the sampler is narrower than the frequency band of the signal to be measured, then it is desirable for it to permit distortion of the signal to be measured, or to be further provided with a mechanism that compensates for such distortion.

The signal processing section 23 is an element for obtaining the time differences ($\Delta t$), the amplitude differences ($\Delta A$), and the phase differences ($\Delta \varphi$) between the main sampling points and the sub-sampling points, and for obtaining the amplitude fluctuations, the phase fluctuations, and the frequency fluctuations of the signal to be measured by employing these time differences ($\Delta t$), amplitude differences ($\Delta A$), and phase difference s($\Delta \varphi$) between the main sampling points and the sub-sampling points. An example of the signal processing section 23 is a computer. Apart from an input/output unit, such a computer comprises a storage unit, a calculation unit, and a control unit, and, on the basis of commands in a control program, is capable of reading out required information, performing calculations of various types, storing the results in an appropriate storage unit, and outputting the results of its calculations from the input/output unit.

Figure 3:
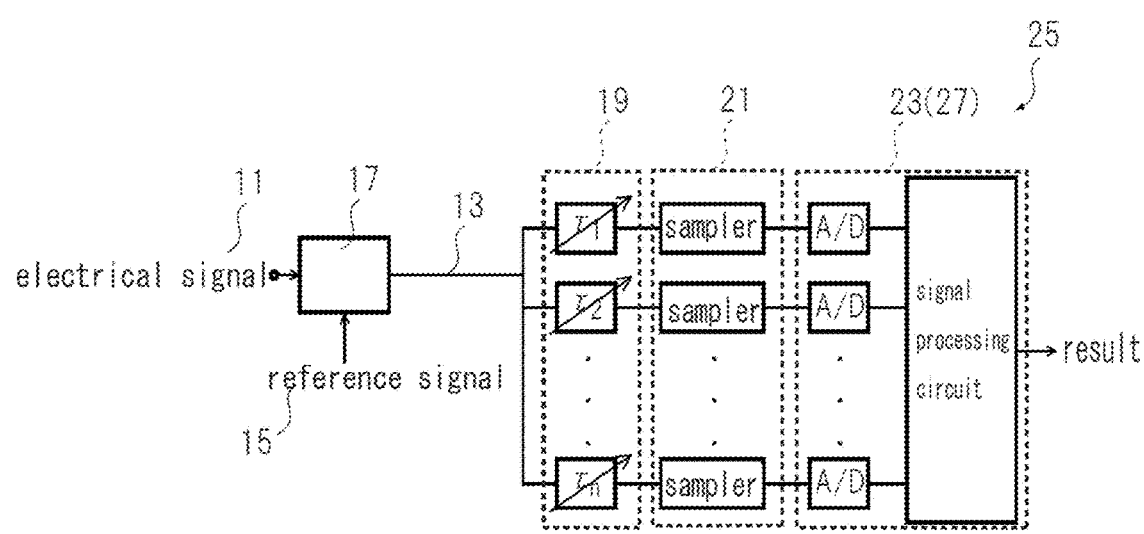
FIG. 3 is a block diagram for explanation of another sampling system according to the present invention.

FIG. 3 is another block diagram for explanation of a sampling system of the present invention. In this example, an electrical signal and a reference signal are inputted to a complex mixer, and are mixed by the complex mixer. The subsequent processing is the same as in the case of the system of FIG. 2.

Figure 4:
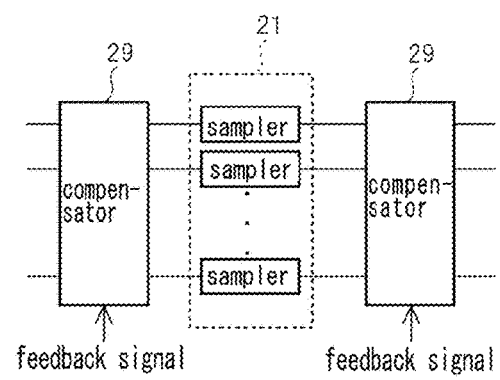
FIG. 4 is a figure showing a part of a preferred example of this sampling system, which includes a reference signal fluctuation acquisition section.

FIG. 4 is a figure showing a part of a preferred example of this sampling system that includes a reference signal fluctuation acquisition section. This sampling system further comprises a reference signal fluctuation acquisition section 27 that obtains the amplitude fluctuations, the phase fluctuations, and the frequency fluctuations of the reference signal between the main sampling points and the sub-sampling points, and a compensation section 29 that compensates the sampling signal sampled by the sampling section 21 or the signal processing section 23 by employing the amplitude fluctuations, the phase fluctuations, and the frequency fluctuations of the reference signal. Since the compensation section 29 is included, accordingly this system becomes capable of compensating for fluctuations of the reference signal. A sampling system including a compensation section is per se known, such as for example described in Japanese Patent Publication 5,598,958 and Japanese Patent Publication 5,522,572. A feedback signal in FIG. 4 is, for example, outputted from the signal processing section 23 or from the compensation section 27 of FIG. 2 or FIG. 3. The feedback signal of FIG. 4 could also be obtained by calculating compensation values by employing the amplitudes and the amplitude fluctuations of the reference signal, the phases and the phase fluctuations of the reference signal, and the frequencies and the frequency fluctuations of the reference signal, and by employing these compensation values as the feedback signal. It would also be possible for measured values from sensors that are provided separately to be subjected to calculation processing by the signal processing section, and for these values to be employed as the feedback signal. Since information related to the values and the fluctuations of the reference signal is included in the feedback signal, accordingly appropriate compensation can be performed by utilizing these values. It would also be possible to arrange to perform this compensation by compensating the input signal itself before it is inputted to the samplers; or it would also be possible to apply appropriate compensation to the signals outputted from the samplers.

Figure 5:
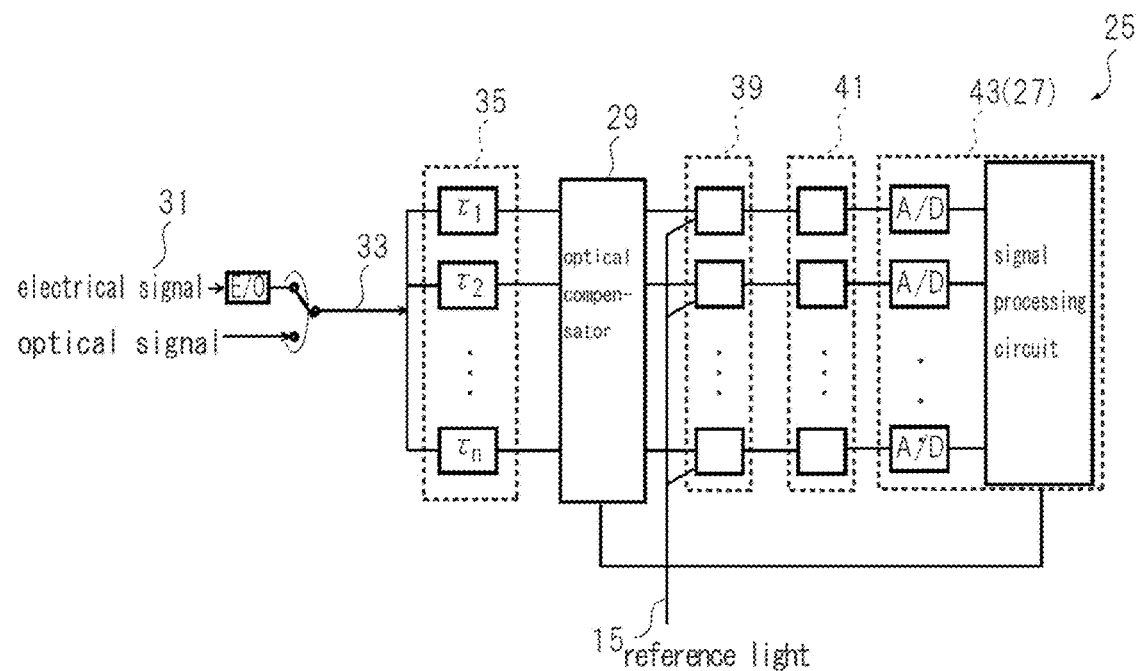
FIG. 5 is a block diagram for explanation of yet another sampling system of the present invention.

FIG. 5 is a block diagram for explanation of another sampling system according to the present invention. As shown in FIG. 5, this sampling system 25 comprises a time delay control section 35, a mixing section 39, a sampling section 41, and a signal processing section 43. The time delay control section 35 is connected in the propagation path 33 along which the signal to be measured 31 propagates, and is an element for obtaining main sampling points at a repetition period of half or less of the frequency band of the signal to be measured, and also for obtaining sub-sampling points by performing sampling at a predetermined time difference from the main sampling points. The mixing section 39 is an element for mixing the signal to be measured, which is outputted from the time delay control section 35, with a reference signal 37. And the sampling section 41 is an element for, at each of the sampling points, obtaining the amplitude difference or ratio, the phase difference or ratio, and the frequency difference or ratio between the signal to be measured and the reference signal. The signal processing section 43 is an element for obtaining the time differences (Δt) between the main sampling points and the sub-sampling points, for obtaining the amplitude differences (ΔA), the phase differences (Δφ), and the frequency differences (Δf) between the main sampling points and the sub-sampling points, and for obtaining the amplitude fluctuations, the phase fluctuations, and the frequency fluctuations of the signal to be measured by employing the time differences (Δt), the amplitude differences (ΔA), the phase differences (Δφ), and the frequency differences (Δf) between the main sampling points and the sub-sampling points.

Figure 6:
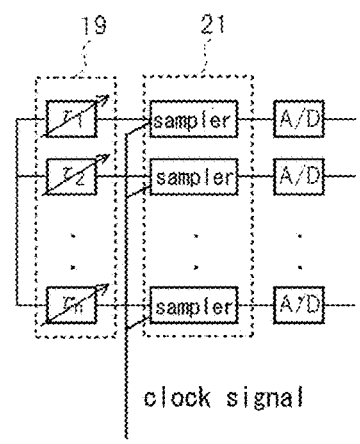
FIG. 6 is a block diagram showing components for providing a time delay.

FIG. 6 is a block diagram showing elements for providing time delays. This example is one in which time delays are applied to the signal by a different method to that explained above. In this example, signals are branched from a mixing section such as a complex mixer or the like, and, after having applied delays to each of the signals that have thus been branched, each signal is inputted to a respective sampler. A clock signal is inputted to the samplers for establishing synchronization.

Figure 7:
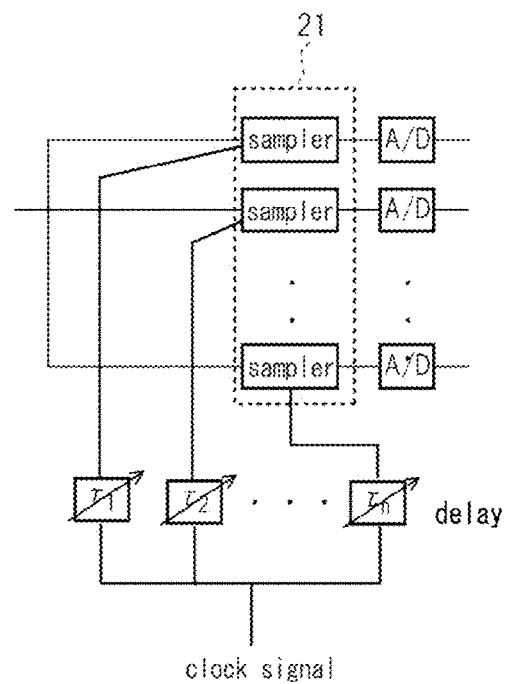
FIG. 7 is another block diagram showing components for providing a time delay.

FIG. 7 is another block diagram showing components for providing time delays. This example is one in which time delays are applied to the signal by a different method to that explained above. In this example, signals are branched from a mixing section such as a complex mixer or the like, and each branched signal is inputted to a corresponding sampler. On the other hand, the clock signal is also branched to each of the samplers, and a delay signal is mixed into each of the branched clock signals, the result then being inputted to the respective sampler.

The sampling system of the present invention may also include components for obtaining the amounts of signal distortion of the signal to be measured (i.e. for obtaining compensation values), by employing any one, or two or more, of the amplitude fluctuations, the phase fluctuations, and the frequency fluctuations of the signal to be measured that have been obtained. This type of component may be part of the signal processing section, or may be provided separately from the signal processing section.

It would be acceptable to arrange for the sampling system of the present invention to compensate for distortion of the signal to be measured by employing the amount of distortion of the signal to be measured (i.e. a compensation value) that has been obtained, or to comprise a demodulation section for obtaining the signal to be measured by correcting for distortion while measuring the signal to be measured.

It would also be acceptable to arrange for the sampling system of the present invention further to comprise a medium information acquisition section that obtains a transfer function for the transmission medium by employing the amount of distortion (i.e. the compensation value) obtained as described above.

Embodiment #1

Figure 8:
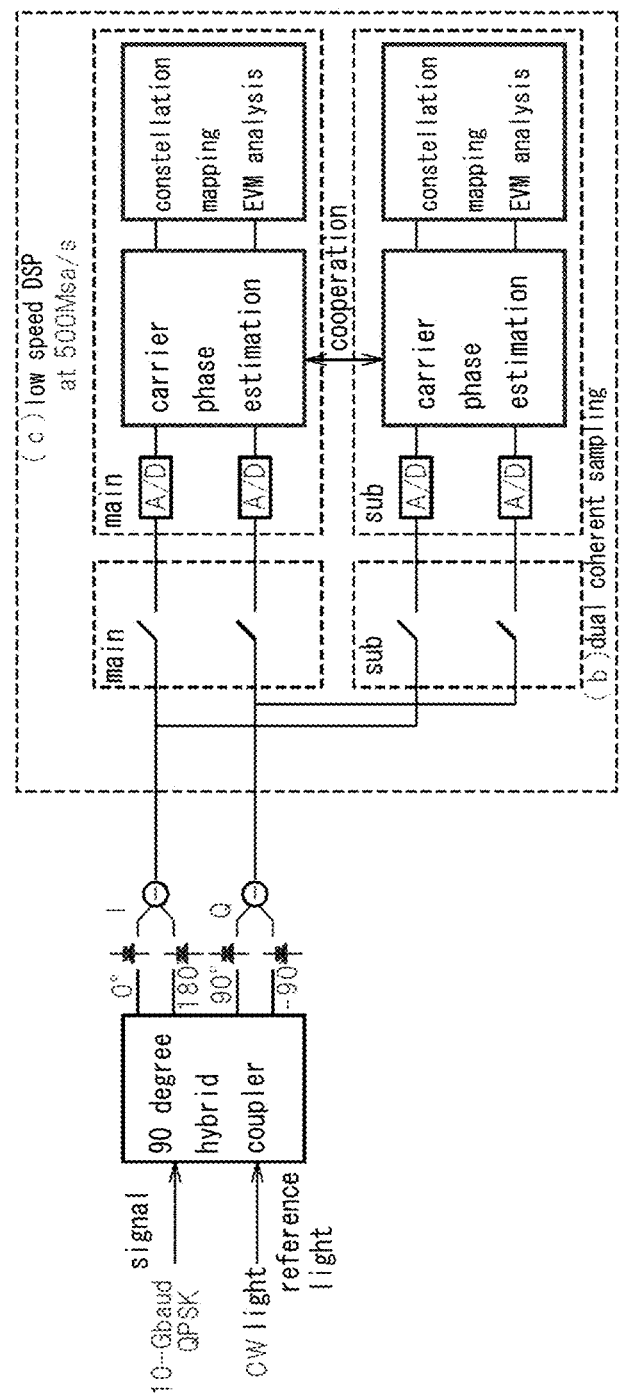
FIG. 8 is a block diagram showing a monitoring system for a QPSK signal which employs the dual sampling technique of the present invention.

FIG. 8 is a block diagram showing a monitoring system for a QPSK signal that employs the dual sampling technique of the present invention.

Here, the dual sampling technique of the present invention was evaluated by employing a high speed real time oscilloscope and off-line signal processing. With this device, a QPSK signal at 10 Gbaud generated by an I/Q modulator on the transmitter side was mixed with local light, which was continuous light, by employing a phase diversity system (a 90° hybrid coupler after balanced demodulation). The I and Q components of the detected signal were observed with a 50 GSa/s real time oscilloscope, and were sent to an off-line DSP unit. The following functions were emulated in the off-line DSP unit: (a) generation of phase noise (optional); (b) dual coherent sampling; and (c) low speed DSP for estimating the carrier phase. In the first portion, the received signal was mixed with numerically controlled local continuous light. In this portion, in order simply to evaluate the influence of phase noise of the laser, homodyne mixing was emulated by mixing together the continuous light and a predetermined amount of phase noise. In this portion, the laser frequency offset between the received signal and the local light was cancelled by adjusting the wavelength of the numerically controlled local light.

A 90° hybrid optical coupler separates an inputted signal into its Q component and its I component. Samplers detect each of the Q component and the I component into which the hybrid coupler has separated the signal. Various types of multilevel signal, such as QPSK (Quadrature Phase Shift Keying), 16QAM, and so on can be employed. Concrete examples of such multilevel signals are 8PSK, 32QAM, 64QAM, 128QAM, and 256QAM.

In the optical phase detector system, the I component and the Q components, which are the projected components of the received signal upon the optical oscillator, are observed by the 90° hybrid coupler and subsequent balanced demodulation.

In order to recover the carrier phase, the observed I and Q components are inputted to a digital signal processor (DSP) system. In this system, low speed sampling is performed at B/n Hz by employing a set of electrical samplers. In the DSP system, the carrier phase of the received system is recovered by employing the I component and the Q component that have been sampled with a digital signal processing algorithm that is similar to digital coherent demodulation (S. Tsukamoto, et al., OFC2005, PDP29; C. Zhang et al., OFC'09, OTuG3, 2009; H. Sun et al., Opt. Express 16, pp. 873-879 (2008)).

In this case, a detection-drive feedback technique is implemented by the DSP. Signal processing for this type of carrier phase recovery can be performed at low cost in real time, even by employing a low speed electrical DSP whose sampling speed is a few MHz. Such a DSP has a loop filter for obtaining an error signal for feedback.

In the next section, dual coherent sampling at 500 MSa/sec is numerically emulated in order to down-convert the 10 Gbaud I/Q signal that has been received. In this embodiment, the time difference τ between the main sampling and the sub-sampling was set to 9 nanoseconds. The constellation was reconstructed from the down-sampled I/Q signal by performing processing with a 500 MHz DSP clock signal. The main and sub-DSPs collaborated so as to match the average value of the phase of the carrier as estimated from the main signals and the sub-sampling signals. When implementing all of the functions emulated by off-line processing in an actual system with a real device, they can be implemented by, for example, employing an optical system and electronic hardware.

Supposing the frequency of the multilevel signal to be f Hz, each of the samplers performs sampling of the multilevel signal at f/n Hz (where n is an integer greater than or equal to 2, with concrete examples of n being $10^2$ or greater and $10^7$ or less, and $5 \times 10^2$ or greater and $10^5$ or less). The complex components are down-converted by these samplers, and are sampled at low speed. In other words, the low speed samplers function as wide band rate converters.

A digital signal processor (DSP) electrically reconstructs the respective complex components from the multilevel signal sampled by the samplers.

Figure 9:
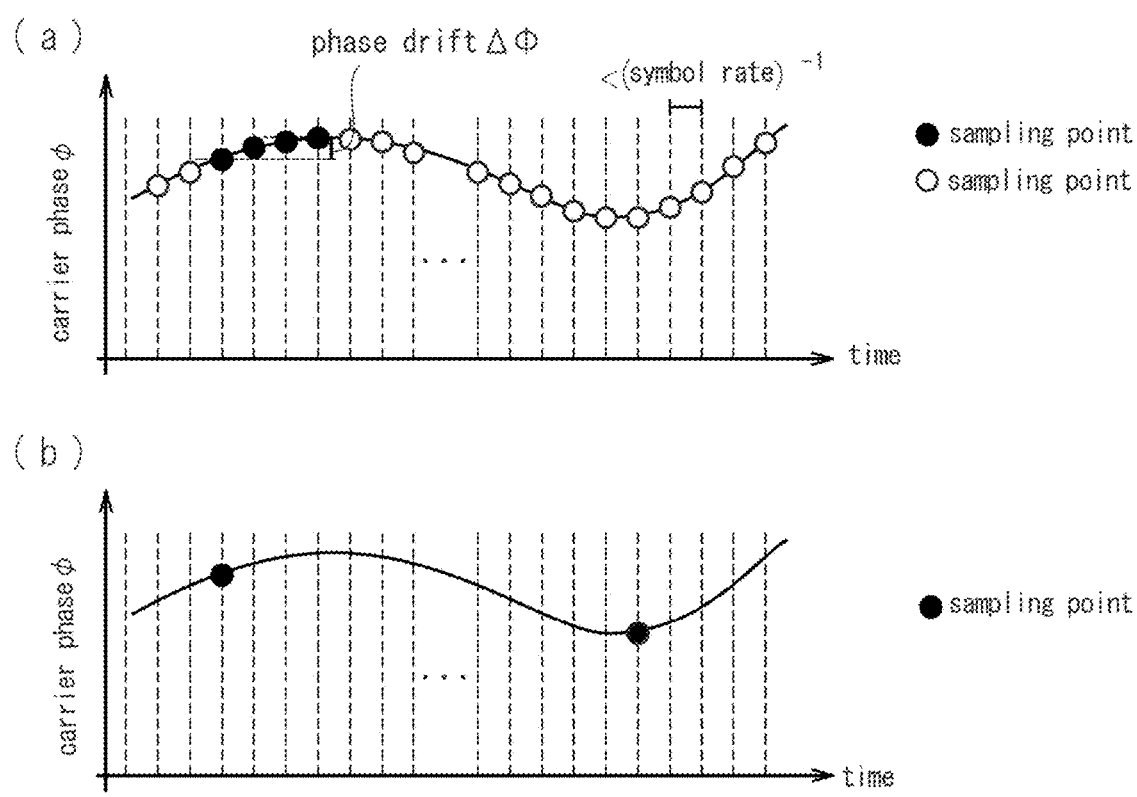
FIG. 9 is a figure for explanation of coherent sampling.
Figure 10:
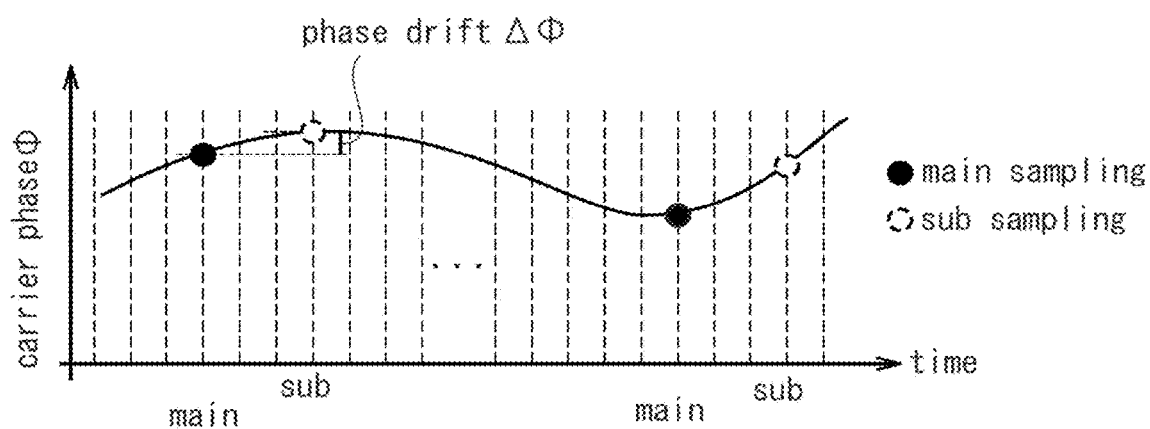
FIG. 10 is another figure for explanation of coherent sampling.
Figure 10:
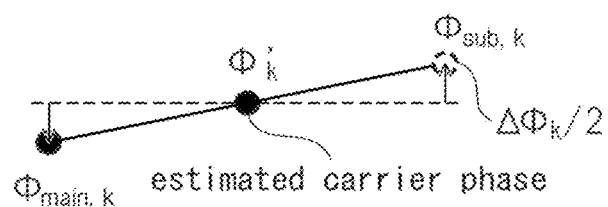

FIG. 9 and FIG. 10 are figures for explanation of coherent sampling. FIG. 9(a) shows full rate sampling (over-sampling) as typically employed in digital homodyne (intradyne) detection, which is a per se known technique. The carrier phase of the received signal is estimated on the basis of a plurality of sampling points that are acquired successively, and, in addition to the function of obtaining the constellation, the phase drift of the carrier due to laser phase noise is also analyzed. And FIG. 9(b) shows equivalent sampling with a single coherent sampling system, which is also a per se known technique. Sampling for obtaining the constellation is, for example, performed at a quite low speed equivalent to around 10 to 100 MSa/sec. However, with this method, it is not possible to ascertain the phase fluctuations at the sampling points. Accordingly the phase fluctuations of the carrier cannot be analyzed. On the other hand, FIG. 10 shows the concept of the dual sampling of the present invention. With this method, in addition to the main sampling points, "sub-" sampling points are present within predetermined time intervals from the main sampling points. Since this sub-sampling is performed within time intervals in which the coherence of the received signal is maintained, accordingly there is no loss of information about the relative phase difference from the sampling signals. Accordingly, as compared to full rate sampling in prior art digital homodyne detection, it is possible to obtain the phase drift of the carrier statistically by employing this information about the relative phase differences, even if the DSP is operated at a rather low speed clock rate.

In the example of FIG. 10, a value intermediate between the phase at the main sampling point and the phase at the sub-sampling point is estimated to be the carrier phase.

Figure 11:
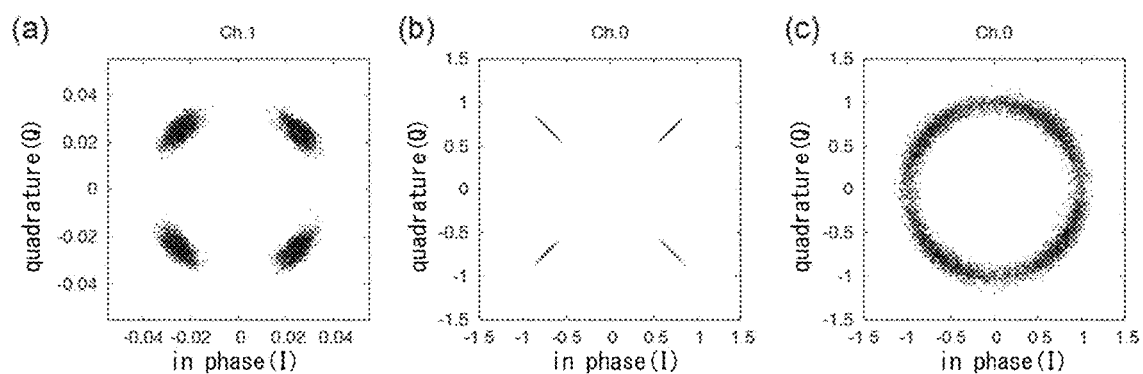
FIG. 11 is a figure showing an example of a measured constellation.
Figure 12:
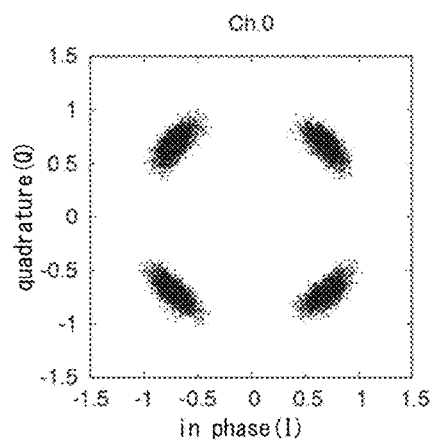
FIG. 12 is another figure showing an example of a measured constellation.

FIG. 11 and FIG. 12 are figures showing examples of constellations when phase noise set to σ=0.012 was added, with σ being defined as the standard phase deviation for each 20 picoseconds. FIG. 11(a) shows a constellation that was measured by employing prior art intradyne detection. This was a case in which the number of sampling points n for estimating the carrier phase was set to 64. And 11(b) shows a constellation that was measured with a single coherent sampling system at 500 MSa/sec. With this method it is not possible to perform tracking of the phase drift, and it will be clearly understood from this result that the phase drift is not ascertained. For this example of N=64, with this example of a digital coherent reception device, as shown in FIG. 11(c), the constellation is not recovered even if a carrier phase estimation algorithm is employed, since the sampling rate is slow as compared to the speed of the laser drift.

On the other hand, FIG. 12 shows a constellation that was obtained by employing the dual coherent sampling system of the present invention. By employing dual coherent sampling and a per se known digital homodyne receiver, the QPSK constellation which was lost due to laser drift is clearly reconstructed.

Figure 13:
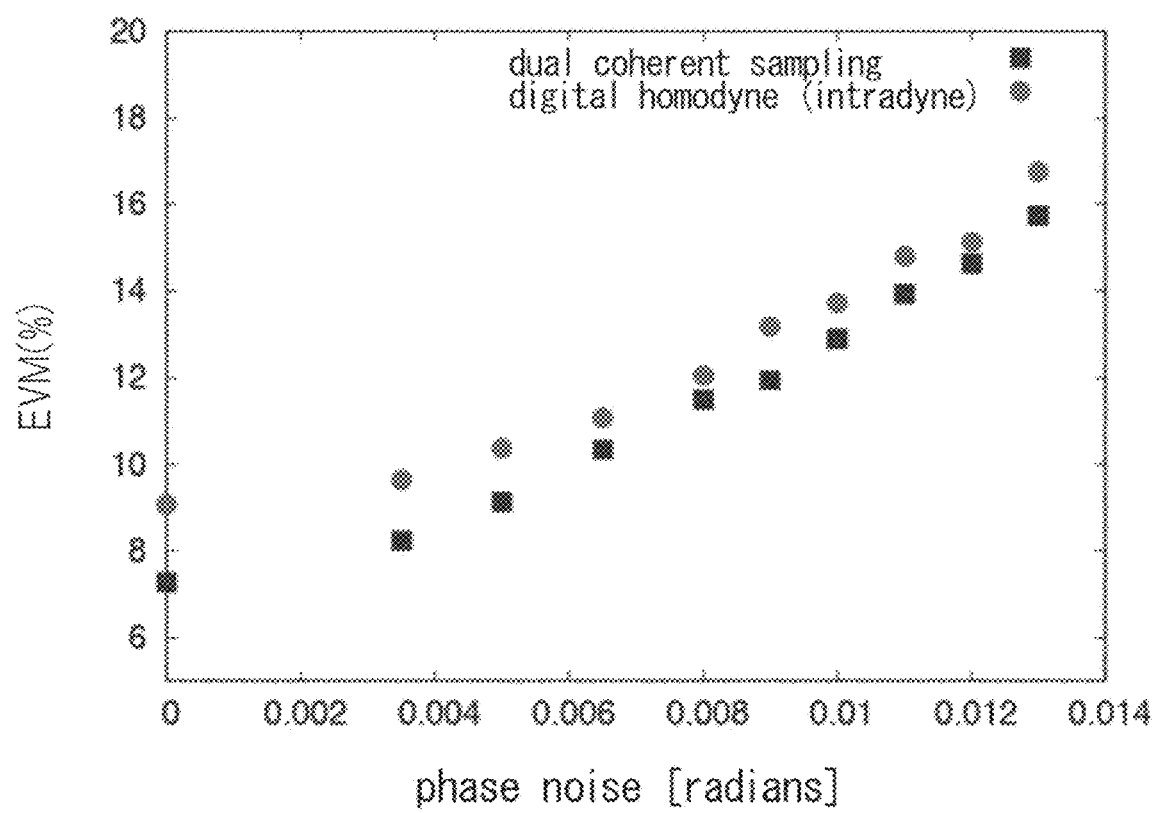
FIG. 13 is a figure showing error vector magnitude (EVM) observed for laser phase noise when phase noise was added to the emulator described above.

FIG. 13 shows an example of error vector magnitude (EVM) observed for laser phase noise when phase noise was added to the emulator described above. This double plot shows the values measured by a digital sampling method, and also the values measured by the dual coherent sampling method. The discrepancy between these two types of EVM is particularly seen in the low phase noise region. This is because in the dual sampling process, on the one hand, the quadrupole term of ASE noise or other Gaussian noise is estimated to be half of its actual value, whereas on the other hand the laser phase drift is accurately evaluated by the random walk noise process. It is considered that this discrepancy can be corrected by a processor that is capable of obtaining the contribution due to ASE noise.

INDUSTRIAL APPLICABILITY

The present invention can be applied in the fields of optical communication, wireless communication, and electrical communication.

REFERENCE SIGNS LIST

11: signal to be measured; 13: propagation path; 15: reference signal; 17: mixing section; 19: time delay control section; 21: sampling section; 23: signal processing section; 25: sampling system; 27: compensation section; 31: signal to be measured; 33: propagation path; 35: time delay control section; 37: reference signal; 39: mixing section; 41: sampling section; 43: signal processing section; 45: sampling system.

The invention claimed is:

1. A sampling method, comprising:
   a process of obtaining main sampling points at a repetition period that is half or less of the frequency band of the signal to be measured, which is the subject for measurement;
   a process of obtaining sub-sampling points by performing sampling that is different from said main sampling points;
   a process of, at each sampling point, obtaining the amplitude difference or ratio, the phase difference or ratio, and the frequency difference or ratio of said signal to be measured and a reference signal;
   a process of obtaining the time differences ($\Delta t$) between said main sampling points and said sub-sampling points;
   a process of obtaining amplitude differences ($\Delta A$), phase differences ($\Delta \varphi$), and frequency differences ($\Delta f$) between said main sampling points and said sub-sampling points, wherein said amplitude differences ($\Delta A$), said phase differences ($\Delta \varphi$), and said frequency differences ($\Delta f$) are respectively the amplitude differences or ratio differences of the signal to be measured and the reference signal, the phase differences or ratio differences of the signal to be measured and the reference signal, and the frequency differences or ratio differences of the signal to be measured and the reference signal, at said main sampling points and said sub-sampling points; and
   a process of obtaining the amplitude fluctuations, the phase fluctuations, and the frequency fluctuations of said signal to be measured by employing the time differences ($\Delta t$), the amplitude differences ($\Delta A$), the phase differences ($\Delta \varphi$), and the frequency differences ($\Delta f$) between said main sampling points and said sub-sampling points.

2. A sampling method according to claim 1, wherein two sub-sampling points are present for each of said main sampling points.

3. A sampling method according to claim 1, further comprising:
   a process of obtaining the amplitude fluctuations, the phase fluctuations, and the frequency fluctuations of said reference signal between said main sampling points and said sub-sampling points; and a process of obtaining sampling correction values at the main sampling points and the sub-sampling points by employing the amplitude fluctuations, the phase fluctuations, and the frequency fluctuations of said reference signal that have been obtained;

and wherein the process of obtaining the amplitude differences ($\Delta A$), the phase differences ($\Delta \varphi$), and the frequency differences ($\Delta f$) between said main sampling points and said sub-sampling points is a process of obtaining the amplitude differences ($\Delta A$), the phase differences ($\Delta \varphi$), and the frequency differences ($\Delta f$) between said main sampling points and said sub-sampling points by employing said sampling correction values and the amplitude differences, the phase differences, and the frequency differences between the signal to be measured and the reference signal at each of the sampling points.

4. A sampling system (25), comprising:

a mixing section (17) that is connected in a propagation path (13) along which a signal to be measured (11) is propagated, and that mixes the signal to be measured (11) propagated along said propagation path (13) and a reference signal (15);

a time delay control section (19) for, from the signal to be measured and said reference signal that have been mixed by said mixing section (17), obtaining main sampling points at a repetition period that is half or less of the frequency band of said signal to be measured, and obtaining sub-sampling points at which sampling that is different from said main sampling points is performed;

a sampling section (21) that, at each sampling point, obtains the amplitude difference or ratio, the phase difference or ratio, and the frequency difference or ratio of said signal to be measured and the reference signal; and a signal processing section (23);

and wherein said signal processing section (23):

obtains the time differences ($\Delta t$) between said main sampling points and said sub-sampling points;

obtains amplitude differences ($\Delta A$) which are the amplitude differences or ratio differences of the signal to be measured and the reference signal at said main sampling points and said sub-sampling points, phase differences ($\Delta \varphi$) which are the phase differences or ratio differences of the signal to be measured and the reference signal at said main sampling points and said sub-sampling points, and frequency differences ($\Delta f$) which are the frequency differences or ratio differences of the signal to be measured and the reference signal at said main sampling points and said sub-sampling points; and obtains the amplitude fluctuations, the phase fluctuations, and the frequency fluctuations of said signal to be measured by employing said time differences ($\Delta t$), said amplitude differences ($\Delta A$), said phase differences ($\Delta \varphi$), and said frequency differences ($\Delta f$) between said main sampling points and said sub-sampling points.

5. A sampling system (25) according to claim 4, further comprising:

a reference signal fluctuation acquisition section (27) that obtains the amplitude fluctuations, the phase fluctuations, and the frequency fluctuations of said reference signal between said main sampling points and said sub-sampling points; and a compensation section (29) that compensates the sampling signals that have been sampled by the sampling section (21) or the signal processing section (23) by employing the amplitude fluctuations, the phase fluctuations, and the frequency fluctuations of said reference signal.

6. A sampling system (45), comprising:

a time delay control section (35) that is connected in a propagation path (33) along which a signal to be measured (31) is propagated, for obtaining main sampling points at a repetition period that is half or less of the frequency band of said signal to be measured, and also for obtaining sub-sampling points by performing sampling at a predetermined time difference from said main sampling points;

a mixing section (39) for mixing the signal to be measured outputted from said time delay control section (35) and a reference signal (37);

a sampling section (41) that, at each sampling point, obtains the amplitude difference or ratio, the phase difference or ratio, and the frequency difference or ratio of said signal to be measured and the reference signal; and a signal processing section (43);

wherein said signal processing section (43):

obtains the time differences ($\Delta t$) between said main sampling points and said sub-sampling points;

obtains amplitude differences ($\Delta A$) which are the amplitude differences or ratio differences of said signal to be measured and the reference signal at said main sampling points and said sub-sampling points, phase differences ($\Delta \varphi$) which are the phase differences or ratio differences of said signal to be measured and the reference signal at said main sampling points and said sub-sampling points, and frequency differences ($\Delta f$) which are the frequency differences or ratio differences of said signal to be measured and the reference signal at said main sampling points and said sub-sampling points; and obtains the amplitude fluctuations, the phase fluctuations, and the frequency fluctuations of said signal to be measured by employing the time differences ($\Delta t$), the amplitude differences ($\Delta A$), the phase differences ($\Delta \varphi$), and the frequency differences ($\Delta f$) between said main sampling points and said sub-sampling points.

* * * * *